US011520167B2

(12) United States Patent
Shi et al.

(10) Patent No.: US 11,520,167 B2
(45) Date of Patent: Dec. 6, 2022

(54) ENVIRONMENTAL SCANNING ELECTRON MICROSCOPY ANALYSIS FOR CONTACT LENS COATING SELECTION AND MANUFACTURING

(71) Applicant: Alcon Inc., Fribourg (CH)

(72) Inventors: Xinfeng Shi, Southlake, TX (US); James Yuliang Wu, Arlington, TX (US); David B. Cantu-Crouch, Fort Worth, TX (US)

(73) Assignee: Alcon Inc., Fribourg (CH)

( * ) Notice: Subject to any disclaimer, the term of this patent is extended or adjusted under 35 U.S.C. 154(b) by 424 days.

(21) Appl. No.: 16/695,986

(22) Filed: Nov. 26, 2019

(65) Prior Publication Data

US 2020/0174283 A1    Jun. 4, 2020

Related U.S. Application Data

(60) Provisional application No. 62/773,535, filed on Nov. 30, 2018.

(51) Int. Cl.
*G02C 7/04* (2006.01)
*H01J 37/28* (2006.01)

(52) U.S. Cl.
CPC .............. *G02C 7/049* (2013.01); *H01J 37/28* (2013.01)

(58) Field of Classification Search
CPC .......... G02C 7/049; G02B 1/043; G02B 1/10; B29D 11/00038; B29D 11/00067; B29D 11/00076; B29D 11/00865; B29D 11/00923; B29D 11/0098; G01N 2223/61; G01N 23/2251
See application file for complete search history.

(56) References Cited

U.S. PATENT DOCUMENTS

| | | | |
|---|---|---|---|
| 8,480,227 B2 | 7/2013 | Qiu et al. | |
| 2002/0197414 A1 | 12/2002 | Chabrecek | |
| 2010/0303911 A1* | 12/2010 | Sheardown | A61K 9/0051 424/486 |
| 2011/0305872 A1* | 12/2011 | Li | A61L 29/06 428/141 |
| 2012/0026458 A1 | 2/2012 | Qiu et al. | |

(Continued)

OTHER PUBLICATIONS

Nuraje et al., Durable Antifog Films from Layer-by-Layer Molecularly Blended Hydrophilic Polysaccharides, Langmuir, 27-2, Jan. 18, 2011, 782-791.

(Continued)

*Primary Examiner* — Mustak Choudhury
(74) *Attorney, Agent, or Firm* — Sheng-Hsin Hu

(57) ABSTRACT

Use of high resolution environmental scanning electron microscopy to capture images of contact lens coating layers, enabling measurement of the coating thickness and structures of the coating layer to be precisely characterized. The coating layer can be directly visualized and quantitatively measured. Furthermore, controlled environments of varying temperatures and varying levels of relative humidity can be established in environmental scanning electron microscopy, such that the dynamic changes of the coating in such conditions can be imaged and measured. The controlled environments can be set up to mimic either the manufacturing process conditions, or be set up to simulate lens-on-eye conditions.

14 Claims, 2 Drawing Sheets

(56) References Cited

U.S. PATENT DOCUMENTS

2013/0155370 A1\* 6/2013 Zhang .................... G02C 7/049
                                                                         351/159.33
2013/0158211 A1   6/2013 Zhang
2018/0079158 A1\* 3/2018 Qiu ........................ G02B 1/043

OTHER PUBLICATIONS

Y. Zhang et al., Metal coating on suspended carbon nanotubes and its implication to metal-tube interaction, Chemical Physics Letters, 2000, 35-41.

\* cited by examiner

ENVIRONMENTAL SCANNING ELECTRON MICROSCOPY ANALYSIS FOR CONTACT LENS COATING SELECTION AND MANUFACTURING

This application claims the benefit under 35 USC 119(e) of the U.S. Provisional Patent Application No. 62/773,535 filed Nov. 30, 2018, incorporated herein by reference in its entirety.

FIELD

The present invention relates to imaging, characterization and analysis of contact lens surfaces and contact lens coatings.

BACKGROUND

Contact lenses are widely used for correcting many different types of vision deficiencies. They may be made of a hydrated, crosslinked polymeric material such as a silicone hydrogel material (SiHy) that contains silicone and a certain amount of water within the lens polymer matrix at equilibrium. For SiHy contact lenses, high oxygen permeability, which is required for a contact lens to have minimal adverse effects upon corneal health, is achieved by incorporating silicone in the crosslinked polymeric material due to silicone having a high affinity for and ability to transport oxygen.

Incorporation of silicone in a contact lens material may have undesirable effects on the biocompatibility of the contact lens, because silicone is hydrophobic and has a tendency to migrate onto the lens surface being exposed to air. As a result, a SiHy contact lens will generally require a surface modification process to eliminate or minimize the exposure of silicone of the contact lens and to maintain a hydrophilic surface. Such treatments known include, for example, various plasma treatments (e.g., Air Optix® lenses from Alcon Laboratories, Inc. or PureVision® from Bausch & Lomb); internal wetting agents physically and/or chemically embedded in the SiHy polymer matrix (e.g., Acuvue® Oasys® and Acuvue® Advance® from Johnson & Johnson; Biofinity® and Avaira® from CooperVision).

More recent advances in contact lenses include SiHy lenses having a relatively thick, lubricious coating which exhibits a gradient in water content ("water gradient") with the coating's water content being lowest at the lens surface and highest at the outermost edge of the coating (e.g., DAILIES® TOTAL1® from Alcon Laboratories, Inc.). Because the outermost edge of the coating layer can have as much as 80% water to 100% water, characterizing the thickness and other features of the lens coating may present challenges. One method of characterizing such a coating's water content, thickness, compression modulus and compression modulus gradient is by the use of atomic force microscopy such as is described in U.S. Pat. No. 8,480,227. However, there is still a need for additional characterization methods.

SUMMARY

These and still further objects are met by the embodiments of the method according to the invention, which includes selecting a lens coating for a coated contact lens by:
providing at least one preformed contact lens in a dry state;
subjecting the at least one preformed contact lens to one or more surface treatment steps to obtain at least one contact lens with coating thereon;
analyzing the at least one contact lens with coating thereon using environmental scanning electron microscopy; and
selecting the desired coating material based on said environmental scanning electron microscopy analysis.

According to a further aspect, the method can include subjecting multiple different contact lenses with various coatings thereon, which are analyzed using environmental scanning electron microscopy.

In still a further aspect, the method of claim can include having the step of analyzing using environmental scanning electron microscopy be performed while the lens is in an aqueous environment or in an atmospheric environment having relative humidity of 90% or greater.

In yet still a further aspect, the preformed contact lens may be a hydrogel contact lens such as a silicone hydrogel contact lens.

BRIEF DESCRIPTION OF THE DRAWING

Further details and advantages of the invention will become apparent from the following description of exemplary embodiments of the invention with the aid of the drawings, in which.

DETAILED DESCRIPTION

Figure 1:
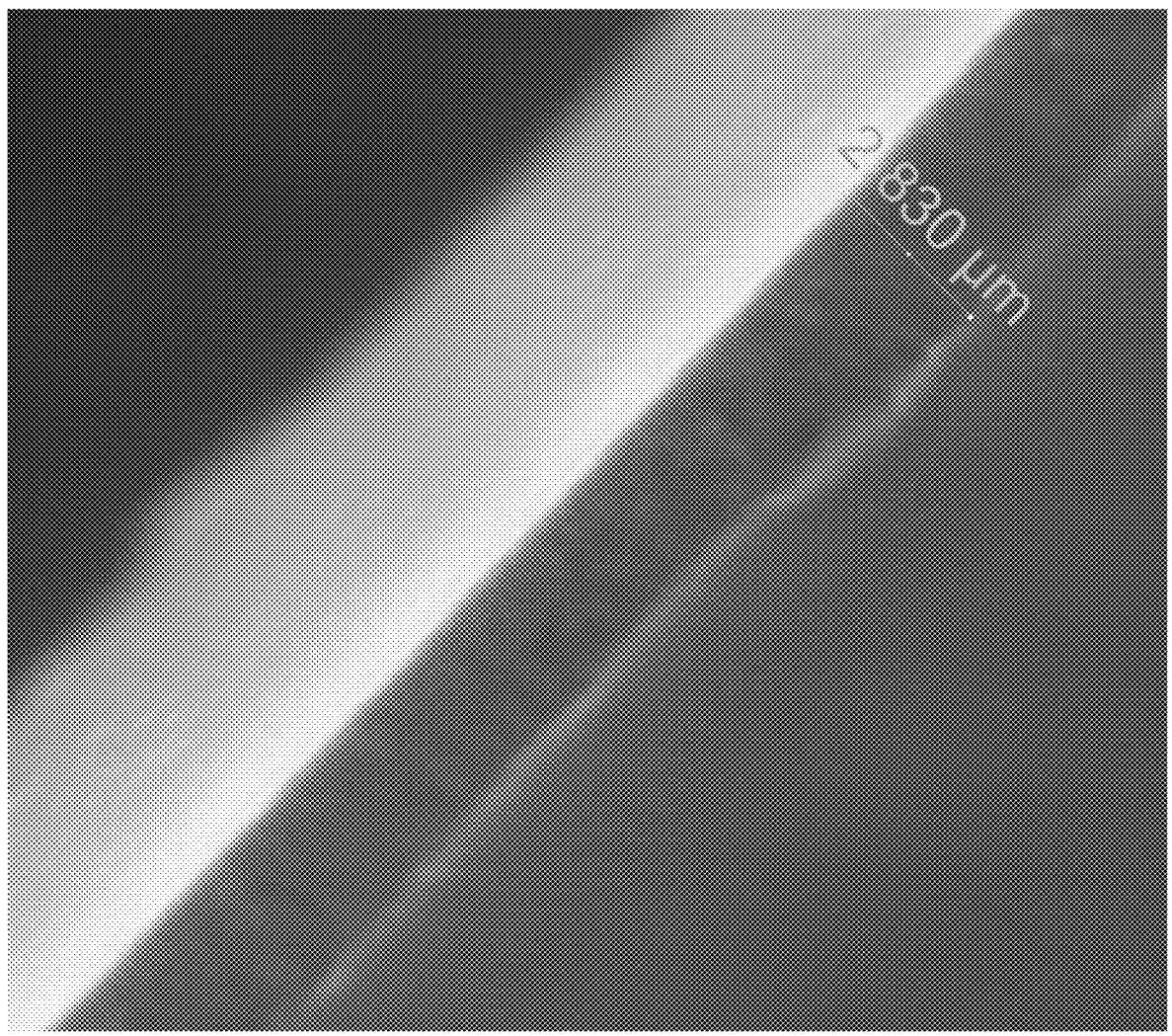
FIG. 1 shows an Environmental Scanning Electron Microscopy (ESEM) image of a coated silicon hydrogel contact lens in cross section at fully hydrate condition.
Figure 2:
FIG. 2 shows an Environmental Scanning Electron Microscopy (ESEM) image of a coated silicon hydrogel contact lens in cross section at dry condition.

Throughout the entire specification including the appended claims, the singular forms "a", "an", and "the" include the plural, unless the context explicitly dictates otherwise. Also, whenever features are combined with the term "or", the term "or" is to be understood to also include "and" unless it is evident from the specification that the term "or" must be understood as being exclusive.

As used in this application, the term "silicone hydrogel contact lens" refers to a contact lens comprising a silicone hydrogel material.

As used in this application, the term "hydrogel" or "hydrogel material" refers to a crosslinked polymeric material which is not water-soluble and can contains at least 10% by weight of water within its polymer matrix when fully hydrated.

As used in this application, the term "non-silicone hydrogel" refers to a hydrogel that is theoretically free of silicon.

As used in this application, the term "silicone hydrogel" refers to a hydrogel containing silicone. A silicone hydrogel typically is obtained by copolymerization of a polymerizable composition comprising at least one silicone-containing vinylic monomer or at least one silicone-containing vinylic macromer or at least one silicone-containing prepolymer having ethylenically unsaturated groups.

As used in this application, the term "vinylic monomer" refers to a compound that has one sole ethylenically unsaturated group and can be polymerized actinically or thermally.

As used in this application, the term "olefinically unsaturated group" or "ethylenically unsaturated group" is employed herein in a broad sense and is intended to encompass any groups containing at least one >C=C< group. Exemplary ethylenically unsaturated groups include without limitation (meth)acryloyl

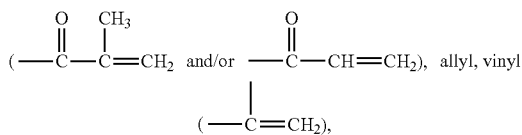

styrenyl, or other C=C containing groups.

As used in this application, the term "(meth)acrylamide" refers to methacrylamide and/or acrylamide.

As used in this application, the term "(meth)acrylate" refers to methacrylate and/or acrylate.

As used in this application, the term "macromer" or "prepolymer" refers to a medium and high molecular weight compound or polymer that contains two or more ethylenically unsaturated groups. Medium and high molecular weight typically means average molecular weights greater than 700 Daltons.

As used in this application, the term "crosslinker" refers to a compound having at least two ethylenically unsaturated groups. A "crosslinking agent" refers to a crosslinker having a molecular weight of about 700 Daltons or less.

As used in this application, the term "polymer" means a material formed by polymerizing/crosslinking one or more monomers or macromers or prepolymers.

As used in this application, the term "molecular weight" of a polymeric material (including monomeric or macromeric materials) refers to the weight-average molecular weight unless otherwise specifically noted or unless testing conditions indicate otherwise.

As used in this application, the term "cross section" of a SiHy contact lens refers to a lens section obtained by cutting through the lens with a knife or cutting tool at an angle substantially normal to either of the anterior and posterior surfaces of the lens. A person skilled in the art knows well to cut manually (i.e., hand cut), or with Cryosta Microtome or with a lath, a contact lens to obtain a cross section of the contact lens. A resultant cross section of a contact lens can be polished by using ion etching or similar techniques.

As used in this application, the term "anterior outer hydrogel layer" in reference to a SiHy contact lens of the invention means a hydrogel layer that includes the anterior surface of the contact lens, is substantially uniform in thickness (i.e., variation in thickness is not more than about 10% from the average thickness of that layer), and has an average thickness of at least about 0.1 μm. The "average thickness" of an anterior outer hydrogel layer is simply referred to as the "thickness of an anterior outer hydrogel layer" in this application.

As used in this application, the term "posterior outer hydrogel layer" in reference to a SiHy contact lens of the invention means a hydrogel layer that includes the posterior surface of the contact lens, is substantially uniform in thickness (i.e., variation in thickness is not more than about 10% from the average thickness of that layer), and has an average thickness of at least about 0.1 μm. The "average thickness" of a posterior outer hydrogel layer is simply referred to as the "thickness of a posterior outer hydrogel layer" in this application.

As used in this application, the term "inner layer" in reference to a SiHy contact lens of the invention means a layer that includes a central curved plane (which divides the contact lens into two parts, one containing the anterior surface and the other containing the posterior surface) and has a variable thickness.

As used in this application, the term "crosslinked coating" or "hydrogel coating" interchangeably is used to describe a crosslinked polymeric material having a three-dimensional network that can contain water when fully hydrated. The three-dimensional network of a crosslinked polymeric material can be formed by crosslinking of two or more linear or branched polymers through crosslinkages.

As used in this application, the term "water-swelling ratio," (WSR) in reference to an anterior or posterior outer hydrogel layer of a hydrogel material of a SiHy contact lens of the invention, means a value determined with Environmental Scanning Microscopy (ESEM) according to $WSR = L_{Wet}/L_{Dry} \times 100\%$ in which WSR is the water-swelling ratio of one of the anterior and posterior outer hydrogel layer, $L_{Wet}$ is the average thickness of that outer hydrogel layer of the SiHy contact lens in fully hydrated state as measured with Environmental Scanning Electron Microscopy (ESEM) on a cross section of the SiHy contact lens in fully hydrated state (e.g. in water or in phosphate buffered solution, pH ~7.3±0.2), and $L_{Dry}$ is the average thickness of that outer hydrogel layer of the SiHy contact lens in dry state as measured with Environmental Scanning Electron Microscopy (ESEM) on a cross section of the SiHy contact lens in dry state with air dry the sample at room temperature for >2 hour and then dry under vacuum (<0.01 Pa) overnight. According to the present application, the desired coating material has the water-swelling ration of at least 110%, preferably 150%, more preferably 200%, even more preferably 250%, furthermore preferably 300%.

Traditional SEM is operated at high vacuum mode ($10^{-2}$ to $10^{-4}$ Pa pressure), which will dry the lens sample and shrink the high water content coating materials. Freeze-drying process cannot guarantee the integrity of coating layer without shrinking. Only ESEM can provide 100% humidity environment to prevent coating shrinkage thus allow the measurement of wet (fully hydrated) coating.

To measure the thickness of dry coating layer with ESEM, the sample is typically dried in air or nitrogen at room temperature overnight and then dried under vacuum (<0.01 Pa) overnight. The advantage of this drying method is to be able to fully shrink the coating materials in dry state, while freeze-drying process will freeze the coating and then remove the ice, leaving many voids in the coating layer.

ESEM method is different from the AFM (atomic force microscopy) methods used U.S. Pat. No. 8,480,227. For AFM, local imaging areas and sensitive to cross-section edge and orientation. In addition, it is very difficult for AFM to measure the coating thickness at dry state because drying will change the coating and make it difficult to be differentiable or even non-differentiable to the core material. The above problems prompted this invention.to develop to use ESEM to measure the coating thickness of coated Silicone hydrogel contact lens.

Since the U.S. launch of DAILIES TOTAL1® (delefilcon A) contact lens in 2013, water gradient technology has demonstrated to be a revolutionary breakthrough to achieve superior surface properties and exceptional comfort throughout the day for millions of silicone hydrogel (SiHy) contact lens wearers. In this study, several water gradient contact lenses were characterized in fully hydrated conditions to reveal the unique structures and properties of water gradient coatings.

Water gradient technology can create novel coatings with water gradient and superior softness on different silicone hydrogel core materials. This fundamentally new approach of generating unique surface with superhydrophilicity and lasting lubricity on tailorable and high oxygen permeable core materials opens the door of the next generation of contact lenses for all-day comfort and ocular health in the digital era.

Environmental scanning electron microscopy can be used to image and measure water gradient (WG) and other coating layers on contact lenses in fully hydrated conditions, or in conditions of very high relative humidity (e.g., approaching 100%) for preparation, evaluation, selection and optimization of coating chemistry and manufacturing process. Environmental scanning electron microscopy can also be used to directly visualize and characterize the hydration and dehydration dynamics of different coating materials, such as poly(acrylic acid) (PAA), poly(methacrylic acid) (PMAA), 2-methacryloyloxyethyl phosphorylcholine (MPC), and the like, to understand how such coatings change with differing temperature and humidity environments.

Environmental scanning electron microscopy can also be used to help predict the coating behaviors during different stages of the manufacturing process, or during different steps of the lens handling processes, and also potentially help predict the on-eye performance of various contact lens coatings.

The fundamental principle of this invention is that the coating samples were prepared and analyzed in fully hydrated conditions, such that their true coating thickness and status can be revealed without confounding factors such as artifacts from processing steps such as drying, freezing, fixation, and labeling, etc. which are generally used in other methods such as atomic force microscopy.

Instead, in this method a coated contact lens is sectioned in water using a sharp blade to expose the cross-section of the coating material and the lens core material. Such cross-sections are then imaged in environmental scanning electron microscopy at high magnifications (typically >1000) and in a high humidity (typically ≥98%) environment. In this way, the coating structures are revealed in their fully hydrated state.

The fundamental principle of this invention is that the coating samples were prepared and analyzed in fully hydrated conditions thus their true coating thickness and status can be revealed without the artifacts from drying, freezing, fixation, and labeling, etc. In general, a coated contact lens is sectioned in water using a sharp blade to expose the cross-section of coating and core materials. Such cross-sections are imaged in ESEM at high magnifications (typically >1000) and high humidity (typically ≥98%) to reveal the coating structures in fully hydrated environment. With high resolution ESEM images of coating layers, coating thickness and structures can be precisely characterized. Furthermore, controlled environments of various temperatures and humidities can be quickly established in ESEM so that the dynamic changes of the coating in such conditions can be imaged and measured. For example, image and measure the coating at 100% humidity, change humidity to 0% and monitor the dimension and morphology changes of the coating over time to characterize its dehydration behaviors; after the coating is fully dried, change humidity to 100% and monitor the dimension and morphology changes of the coating over time to characterize its rehydration behaviors. Another example, compared to material A, material B has slower dehydration rate when decreasing humidity (say from 100% to 0%) or faster rehydration rate when increasing humidity (say from 0% to 100%). Material B might be better than material A as the coating material because it can better retain its hydration state, which is important for contact lenses. Such dehydration/rehydration characteristics can be used to understand material behaviors at different dry or humid environments, select coating materials, optimize process conditions, and mimic lens on-eye conditions.

In some case it may be difficult to differentiate the boundary between a coating layer and the projected surface of the lens on lens cross-section. In this case, cutting lines on cross-section can be created as markers using EDS (Energy Dispersive Spectroscopy) line scan and coating layer can be confirmed from the cutting lines at different tilting angles. Furthermore, in some situations where there is not enough imaging contrast between a coating material and core material, for example, due to similarity in water content, differential staining of the coating material and the core material in hydrated conditions can be developed to enhance the imaging contrast.

The preferred staining is RuO4 staining method. The detail The detailed description of RuO4 staining procedures are described as follow:
1) Desalt a lens in purified water 3× times
2) Cut lens on Parafilm film with clean and defect-free double edge razor blade from front side to back side
3) Prepare RuO4 staining solution by mixing 1 part of stock solution (0.5% RuO4, freshly opened) to 200 parts of purified water
4) Soak the lens sample in RuO4 staining solution for 10 minutes
5) Rinse the lens sample 3× times in fresh water
6) Keep the lens sample in fresh water for a minimum 24 hrs. to allow the completion of the staining reaction
7) Mount the lens sample for imaging Note: the RuO4 concentration and soaking time might be adjusted to achieve optimal staining for different coating materials Other useful staining agents are Osmium tetroxide (OsO4), Phosphotungstic acid (PTA), lead citrate, uranyl acetate, toluidine blue, sudan black, nile red, etc. The basic staining procedures are soaking the sample in each staining solution with certain concentration for certain time and then rinsed by water to remove the stains. The optimized conditions are based on the tests of different concentrations and soaking/rinsing time for the best imaging contrast.

An example for the claim of "selecting the desired coating material based on said environmental scanning electron microscopy analysis" is coating thickness at different humidity conditions, which can be directly measured from ESEM images at controlled temperate and humidity. Coating thickness at dry and fully hydrated conditions and how fast the coating layer will hydrate or dehydrate at different environments can be important for material selection and process improvement of different coatings. Another example is elemental components of different coating surface, which can be quantified by the Oxford AZtec INCA/X-Max Energy-Dispersive Spectroscopy (EDS) attached with the ESEM system.

By using high resolution environmental scanning electron microscopy images of coating layers, the coating thickness and structures of the coating layer can be precisely characterized. The coating layer can be directly visualized and quantitatively measured. Furthermore, controlled environments of varying temperatures and varying levels of relative humidity can be established in environmental scanning electron microscopy, such that the dynamic changes of the coating in such conditions can be imaged and measured. The controlled environments can be set up to mimic either the manufacturing process conditions, or be set up to simulate lens-on-eye conditions.

While embodiments of the invention have been described with the aid of the drawings, various changes, modifications, and alternatives are conceivable without departing from the teaching underlying the invention. Therefore, the invention is not intended to be limited to the described embodiments but rather is defined by the scope of the appended claims.

An example for the claim of "selecting the desired coating material based on said environmental scanning electron microscopy analysis" is coating thickness at different humidity conditions, which can be directly measured from ESEM images at controlled temperate and humidity. Coating thickness at dry and fully hydrated conditions and how fast the coating layer will hydrate or dehydrate at different environments can be important for material selection and process improvement of different coatings. Another example is elemental components of different coating surface, which can be quantified by the Oxford AZtec INCA/X-Max Energy-Dispersive Spectroscopy (EDS) attached with the ESEM system. The previous disclosure will enable one having ordinary skill in the art to practice the invention. Various modifications, variations, and combinations can be made to the various embodiment described herein. In order to better enable the reader to understand specific embodiments and the advantages thereof, reference to the following examples is suggested. It is intended that the specification and examples be considered as exemplary.

Although various aspects and various embodiments of the invention have been described using specific terms, devices, and methods, such description is for illustrative purposes only. The words used are words of description rather than of limitation. It is to be understood that changes and variations may be made by those skilled in the art without departing from the spirit or scope of the present invention, which is set forth in the following claims. In addition, it should be understood that aspects of the various embodiments may be interchanged either in whole or in part or can be combined in any manner and/or used together. Therefore, the spirit and scope of the appended claims should not be limited to the description of the preferred versions contained therein.

EXAMPLES

Coated silicone hydrogel contact lenses are similarly prepared according to the procedures described in Example 19 of U.S. Pat. No. 8,480,227. Each of the coated silicone hydrogel contact lenses has a poly(acrylic acid) (PAA) base coating on a silicone hydrogel contact lens and a hydrogel coating on top of the PAA base coating.

The thickness of coated silicone hydrogel contact lenses are measured at a fully hydrated state and at dry state as follows:

The detailed procedure for measuring coating thickness at fully hydrated state:
1) Sample preparation: Use a soft tweezer to remove a contact lens from its blister pack and rinse the lens with purified water to remove the lens storage solution. Place the lens posterior side up in a polyethylene petri plate (or equivalent). Cut the lens in half using a double edged razor blade. Trim the lens so as to it fit into the SEM clamp mount. The lens piece should be approximately 4.5-5 mm in height.
2) Specimen mounting: Gently use tweezers to pick up lens piece and place long edge of cut lens edge facing up, in the sample holder. Care should be taken to keep the sample straight in the sample holder with approximately ½ to 1 mm of lens protruding from the holder. Add 1-2 drops of purified water to the sample holder to keep the lens piece hydrated.
3) ESEM imaging: Install the GSED or LFD detector in the ESEM. If the LFD detector is used, a pressure limiting accessory cone is also required. Set the accelerating voltage to 5 kV with spot size of 4. Select ESEM mode. Install the Peltier Stage onto SEM stage. Lower stage to ensure below height of GSED or instrument pole piece. Set humidity to ≥98%. Load the sample holder with the section specimens onto the Peltier stage. Push the stage door closed. Click on the pump button within the xTm microscope control software and wait for the Beam On button to become active. This indicates proper chamber pressure has been reached. Bring stage to approximately 5 mm to 10 mm working distance. Turn on electron beam to start viewing the specimen and adjust brightness, contrast, magnification and focus. Move and tilt the stage to find the area of interest for image acquisition. Once an image is captured, open the measurement tool of the ESEM software to measure the thickness of coating.
4) The average coating thickness (5 measurement) at fully hydrated state is 2.63 micron.

The detailed procedure for measuring coating thickness at dry state:
1) Sample preparation: Use a soft tweezer to remove a contact lens from its blister pack and rinse the lens with purified water to remove the lens storage solution. Place the lens posterior side up in a polyethylene petri plate (or equivalent). Cut the lens in half using a double edged razor blade. Trim the lens so as to it fit into the SEM clamp mount. The lens piece should be approximately 4.5-5 mm in height.
2) Specimen mounting and drying: Gently use tweezers to pick up lens piece and place long edge of cut lens edge facing up, in the sample holder. Care should be taken to keep the sample straight in the sample holder with approximately ½ to 1 mm of lens protruding from the holder. Air dry the sample at room temperature for >2 hour and then dry under vacuum overnight.
3) SEM imaging: Set the accelerating voltage to 5 kV with spot size of 4. Select low vacuum mode. Load the sample holder with the section specimens onto the chamber. Push the stage door closed. Click on the pump button within the xTm microscope control software and wait for the Beam On button to become active. This indicates proper chamber pressure has been reached. Bring stage to approximately 5 mm to 10 mm working distance. Turn on electron beam to start viewing the specimen and adjust brightness, contrast, magnification and focus. Move and tilt the stage to find the area of interest for image acquisition. Once an image is captured, open the measurement tool of the ESEM software to measure the thickness of coating.
4) The average coating thickness (5 measurement) at dry state is 0.79 micron.

The SWR for the coated silicone hydrogel contact lenses is 332%.

The invention claimed is:

1. A method of selecting a lens coating for a coated contact lens comprising: providing at least one preformed contact lens in a dry state;
   subjecting the at least one preformed contact lens to one or more surface treatment steps to obtain at least one contact lens with coating thereon; analyzing the at least one contact lens with coating thereon using environmental scanning electron microscopy (ESEM); and selecting the desired coating material based on said ESEM, wherein the step of analyzing the at least one contact lens with coating thereon using ESEM is a determination of a water-swelling ratio (designated as WSR), wherein WSR is a ratio of $L_{wet}$ to $L_{Dry}$ times 100, $L_{wet}$ is an average thickness of the coating layer of the contact lens in fully hydrated state as measured with ESEM on a cross section of the contact lens in fully hydrated state and $L_{Dry}$ is an average thickness of the coating layer of the contact lens in dry state as measured with ESEM on a cross section of the contact lens in dry state obtained by air drying the sample at room temperature for >2 hour and then drying under vacuum (<0.01 Pa) overnight.

2. The method of claim 1 wherein a plurality of different contact lenses with coatings thereon are analyzed using ESEM.

3. The method of claim 1 wherein the step of analyzing is performed while a temperature and a humidity are changed in the ESEM to measure dynamic changes of the coating of the contact lens.

4. The method of claim 1 wherein the preformed contact lens is a silicone hydrogel contact lens.

5. The method of claim 1, wherein the desired coating material having the water-swelling ratio of at least 110% is selected.

6. The method of claim 1, wherein the desired coating material having the water-swelling ratio of at least 150% is selected.

7. The method of claim 1, wherein the desired coating material having the water-swelling ratio of at least 200% is selected.

8. The method of claim 1, wherein the desired coating material having the water-swelling ratio of at least 250% is selected.

9. The method of claim 1, wherein the desired coating material having the water-swelling ratio of at least 300% is selected.

10. The method of claim 1, further comprising the step of staining the coating material using a staining agent before the step of analyzing the at least one contact lens with coating thereon using ESEM.

11. The method of claim 10, wherein the staining agent is selected from a group consisting of Ruthenium Tetroxide (RuO4), Osmium tetroxide (OsO04), Phosphotungstic acid (PTA), lead citrate, uranyl acetate, toluidine blue, sudan black, and nile red.

12. The method of claim 11, wherein the staining agent is Ruthenium Tetroxide (RuO4) or, Osmium tetroxide (OsO4).

13. The method of claim 12, wherein the staining agent is Ruthenium Tetroxide (RuO4).

14. The method of claim 1, comprising providing multiple different contact lenses with various coatings thereon, analysing the contact lenses by ESEM for determining their WSR and selecting a desired coating based on said ESEM analysis.

* * * * *